United States Patent [19]

Akiba et al.

[11] Patent Number: 4,788,690
[45] Date of Patent: Nov. 29, 1988

[54] DISTRIBUTED FEEDBACK SEMICONDUCTOR LASER WITH MONITOR

[75] Inventors: Shigeyuki Akiba; Masashi Usami, both of Tokyo, Japan

[73] Assignee: Kokusai Denshin Denwa Kabushiki Kaisha, Tokyo, Japan

[21] Appl. No.: 942,451

[22] Filed: Dec. 16, 1986

[30] Foreign Application Priority Data

Dec. 25, 1985 [JP] Japan ................................ 60-290846

[51] Int. Cl.[4] .......................... H01S 3/19; H01S 3/08; H01L 31/12
[52] U.S. Cl. ...................................... 372/50; 372/29; 372/96; 357/19
[58] Field of Search ....................... 372/50, 96, 32, 29; 357/19, 17

[56] References Cited

U.S. PATENT DOCUMENTS 4,653,058  3/1987  Akiba et al. ........................... 372/96
4,674,100  6/1987  Kobayashi ............................. 372/96

Primary Examiner—William L. Sikes
Assistant Examiner—Georgia Y. Epps
Attorney, Agent, or Firm—Emmanuel J. Lobato; Robert E. Burns

[57] ABSTRACT

A distributed feedback semiconductor laser with monitor is disclosed, in which the energy gap of a cap layer formed on the laser region and the window region is smaller than the energy gap of the light emitting layer, and in which a pn junction isolated from a pn junction in the laser region is provided in the cap layer on the window region.

3 Claims, 4 Drawing Sheets

DISTRIBUTED FEEDBACK SEMICONDUCTOR LASER WITH MONITOR

BACKGROUND OF THE INVENTION

The present invention relates to a distributed feedback semiconductor laser (hereinafter referred to simply as a "DFB laser") into which a photodiode having a monitor function is integrated.

Since a DFB laser has incorporated therein a diffraction grating of excellent wavelength selectivity, it is capable of achieiveing a single wavelength operation, and is now being developed as a light source for low-loss optical fiber communication and the like. In case of employing a semiconductor laser, it is general practice to monitor the magnitude of its output with a photodiode for the purpose of keeping the optical output constant. In this instance, the semiconductor laser and the photodiode are usually formed by different devices independent of each other. Of semiconductor lasers, the DFB laser not only enables the single wavelength operation but also saves the necessity of a reflecting end face which is requisite for conventional semiconductor lasers, such as a cleavage plane; so that it is suitable for monolithic integration therewith of an element equipped with a function other than laser oscillation. In particular, the above-mentioned photodiode for monitoring the magnitude of the optical output can easily be integrated with the DFB laser.

However, the conventional DFB laser has a defect that the monitor sensitivity undergoes substantial variations with temperature fluctuations.

SUMMARY OF THE INVENTION

An object of the present invention is to provide a distributed feedback semiconductor laser with a monitor which is able to maintain a stable monitor sensitivity, small and easy to manufacture.

The present invention has its feature in that the energy gap of a cap layer formed on the laser region and the window region is smaller than the energy gap of the light emitting layer and in that a pn junction, isolated from a pn junction in the laser region, is provided in the cap layer on the window region.

BRIEF DESCRIPTION OF THE DRAWINGS

The present invention will be described in detail below in comparison with prior art with reference to the accompanying drawings, in which.

DETAILED DESCRIPTION

To make differences between the present invention and prior art clear, examples of prior art will first be described.

Figure 1:
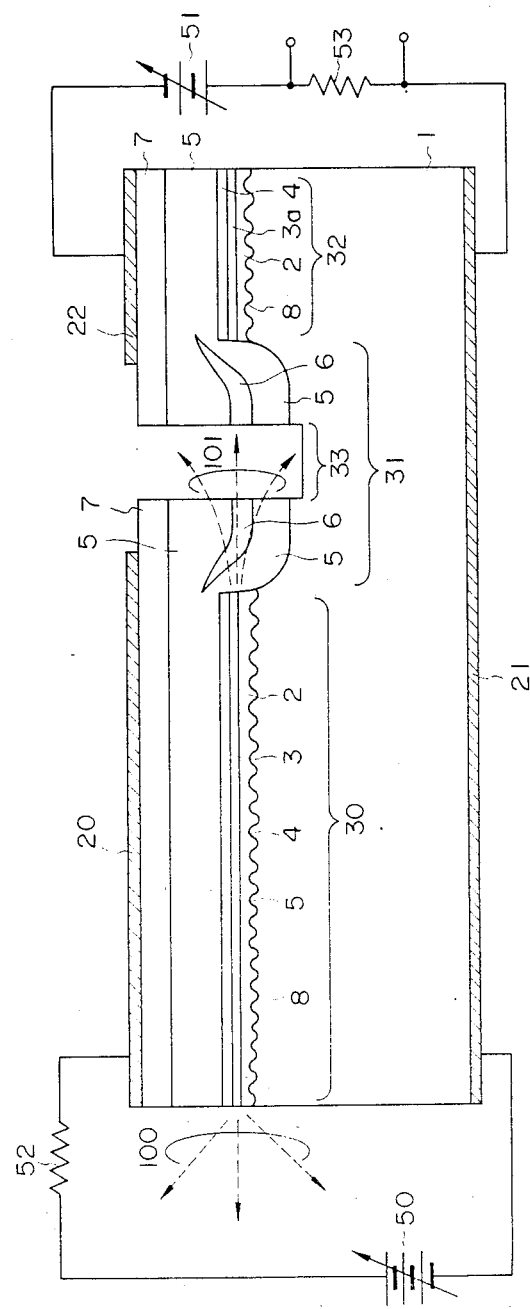
FIG. 1 is a schematic longitudinal-sectional view illustrating an example of a conventional DFB laser with a monitor.

FIG. 1 is a schematic diagram showing a conventional DFB laser with a monitor (Japanese Pat. Pub. Disc. No. 186, 986/83). In this prior art example, a laser region 30 has a structure in which an n-type InGaAsP waveguide layer 2, an InGaAsP light emitting layer 3, a p-type InGaAsP buffer layer 4, and a p-type InP layer 5 are laminated on an n-type InP substrate 1, and effective periodic variations are provided in the refractive index of light in the direction of its travel with a diffraction grating 8 formed by periodically changing the film thickness of the n-type InGaAsP waveguide layer 2. At one end of the light emitting layer 3, the p-type InP layer 5 and an n-type InP layer 6, which are semiconductor layers greater in energy gap than the light emitting layer 3, are embedded, forming a window region 31. At the other end of the window region 31 a monitor region 32 is provided which has the same layer structure as does the laser region 30. Furthermore, a p-type InGaAsP cap layer 7 for depositing thereon electrodes are formed on the three regions 30, 31 and 32. A groove 33 electrically isolates between the laser region 30 and the monitor region 31; a high resistance semiconductor layer may also be provided instead of cutting the groove 33. Reference numerals 20, 21 and 22 indicate electrodes, 50 and 52 a power source and a resistor for the laser region 30, and 51 and 53 a power source and a resistor for the monitor region 32. Reference numeral 100 identifies an optical output emitted from the laser region 30, and 101 an optical output emitted into the window region 31. A portion of the optical output 101 is absorbed by a detecting layer 3a of the same composition as the light emitting layer 3, provided in the monitor region 32, and its electrical output appears as a monitor signal.

Such a DFB laser with a monitor is easy to manufacture, and according to our experiments, a high sensitivity monitor of 0.2 mA/mW or so could be achieved. However, this DFB laser has a defect that the monitor sensitivity undergoes substantial variations with temperature fluctuations since the light detecting layer 3a in the monitor region 32 has the same composition as the light emitting layer 3 in the laser region 30. In other words, since the photon energy of the laser output light 100 or 101 is substantially equal to the energy gaps of the light emitting layer 3 and the detecting layer 3a, the absorption coefficient of the monitor region 32 greatly varies depending upon the relation between the wavelength of the output light and the energy gap of the detecting layer 3a in the monitor region 32. Since the wavelength of the laser output light is based on DFB oscillation, the temperature coefficient of the laser region is as small as about 1 Å/K, whereas the temperature coefficient of the energy gap of the detecting layer 3a is about five times larger than the temperature coefficient of the laser region 30. For example, when temperature rises (or drops) one degree in terms of absolute temperature, the oscillation wave-length of the laser region shifts by about 1 Å toward the long wavelength band (or the short wavelength band). On the other hand, the energy gap of the detecting layer 3a of the monitor region 32 shifts toward the long wavelength (or short wavelength) as large as 5 Å or so, resulting in a substantial increase in the light absorption coefficient of the detecting layer.

Figure 2:
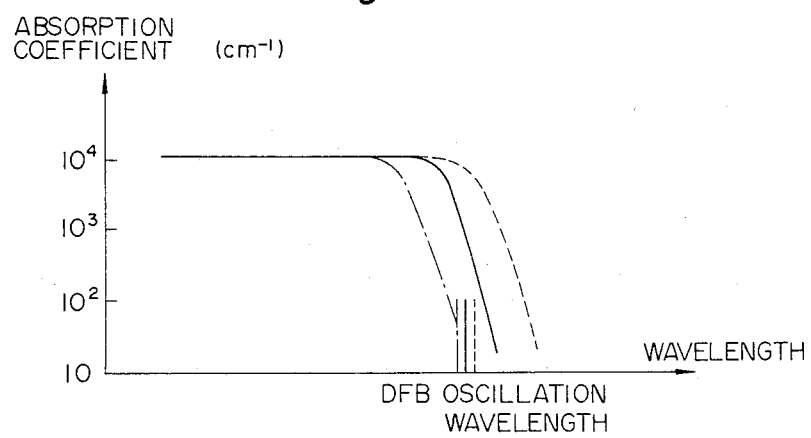
FIG. 2 is a characteristic diagram showing the relationship between the oscillation wavelength of the conventional DFB laser and the absorption coefficient of its detecting layer.

FIG. 2 shows the relationship between the oscillation wavelength of the DFB laser and the absorption coefficient of the detecting layer 3a with respect to temperature variations in the prior art DFB laser with a monitor. In FIG. 2, the solid lines indicate the oscillation wavelength (nearly equal to the energy gap of the light emitting layer 3) of the DFB laser which is determined by the periodic corrugations of the diffraction grating 8 of the laser region 8 at room temperature $t_0$ and the absorption coefficient of the detecting layer 3a of the monitor region 32 which is dependent upon the energy band gap of the layer 3a itself, the broken lines indicate their state at raised temperature, and the one-dot chain line their state at lowered temperature. Since the energy gap of the detecting layer 3a diminishes as temperature rises, the absorption coefficient of the detecting layer 3a extends to the long wavelength band, and when temperature drops, this tendency reverses. Therefore, temperature fluctuations will disturb the rate at which the oscillation output light of the DFB laser is absorbed by the detecting layer 3a, leading to dispersion in the monitor sensitivity as well. Accordingly, the absorption coefficient will undergo substantial variations with temperature fluctuations; so that the detection of the output power by monitoring in an environment in which temperature fluctuates, and practical use of the DFB laser is difficult.

With reference to the accompanying drawings, the present invention will hereinafter be described in detail.

Figure 4:
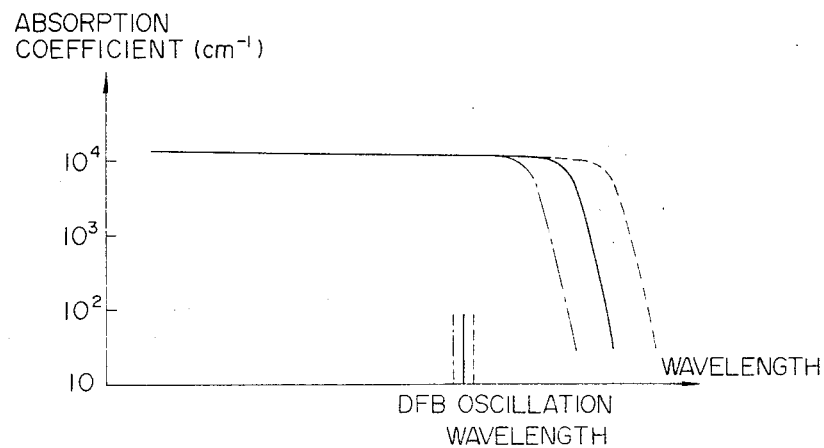
FIG. 4 is a characteristic diagram showing the relationship between the oscillation wavelength of the DFB laser with a monitor according to the present invention and the absorption coefficient of its detecting layer.
Figure 3:
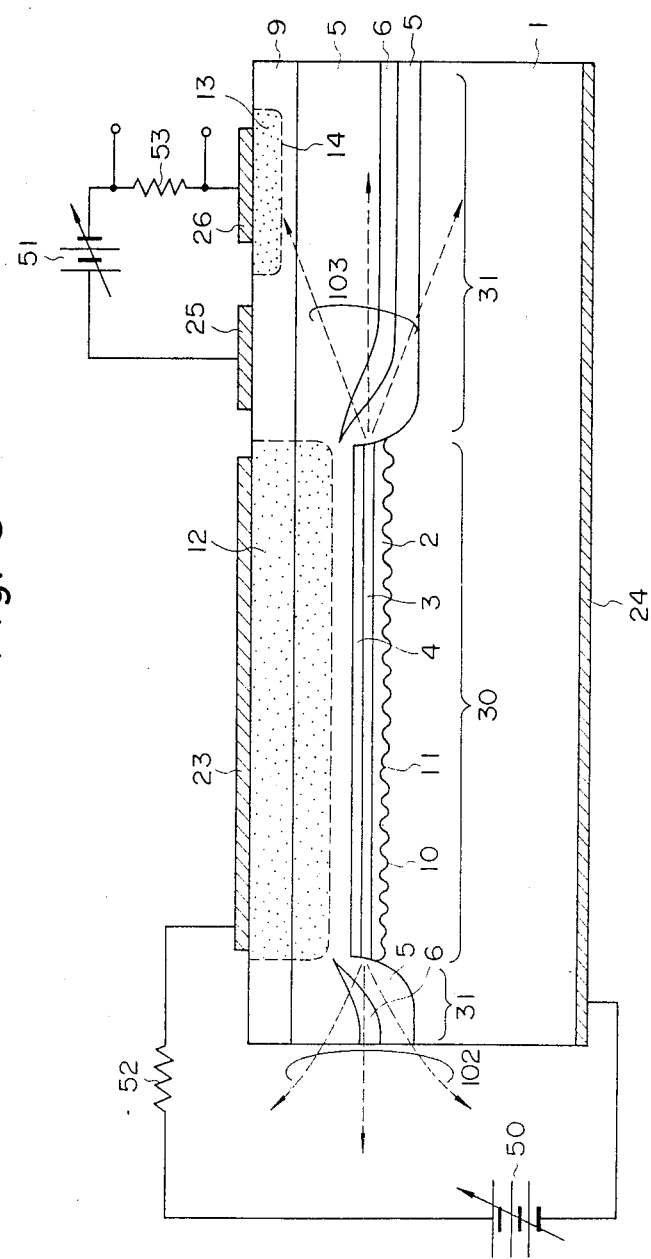
FIG. 3 is a schematic diagram of a DFB laser with a monitor according to the present invention.

FIG. 3 illustrates an embodiment of the present invention, in which, as is the case with FIG. 1, the laser region 30 has the light emitting layer 3 and effective periodic variations in its refractive index in the direction of travel of light, and the light emitting layer 3 is defined at opposite ends by the p-type InP layer 5 and the n-type InP layer 6, each having an energy gap larger than that of the light emitting layer 3. In this embodiment the diffraction grating 10 has a quarter-wave phase shift 11 with a view to improving the stability of the single wavelength oeration. The cap layer 9 provided on the laser region 30 and the window region 31 is formed of n-type InGaAsP or n-type InGaAs whose energy gap is smaller than that of the InGaAsP light emitting layer 3. Reference numerals 12 and 13 indicate zinc-diffused regions for imparting the p-type conductivity of the n-type semiconductor layers. Accordingly, there is formed in the cap layer 9 on the window region 31 a pn junction 14 which is isolated from a pn junction (between the light emitting layer 3 and the buffer layer 4) in the laser region 30. Reference numerals 23 and 24 identify electrodes for the laser and 25 and 26 electrodes for monitoring. Since the quarter-wave phase shift 11 is provided further to the left than the center of the diffraction grating so that laser output light 102 is used as the main output and output light 103 for monitoring, the light output 102 is greater in magnitude than the light output 103 for monitoring. A portion of the output 103 for monitoring is absorbed by the cap layer 9 owing to the Fresnel diffraction at the window region 31 having no waveguide function. Accordingly, the light output 103 is not again fed back to the light emitting layer 3, and stable oscillation of a single wavelength caused by the DFC structure of quarter waveguide is obtained. The light absorbed in the cap layer 9 in the vicnity of the pn junction 14 appears at the resistor 53. In this instance, since the energy gap of the cap layer 9 is smaller than that of the light emitting layer 3, the absorption coefficient of the cap layer is very large originally and hardly changes even if the relationship between the wavelength of the output light 103 and the energy gap of the cap layer 9 is altered by temperature fluctuations. FIG. 4 is a diagrammatic showing of the relationship between the oscillation wavelength of the DFB laser of the present invention and the absorption coefficient of the detecting layer 3a. As is evident from FIG. 4, the absorption coefficient of the detecting layer 3a in the vicinity of the oscillation wavelength of the DFB laser can be made always constant by making the energy gap of the detecting layer 3a to be smaller than that of the light emitting layer 3. Accordingly, a high monitoring efficiency and stable monitoring can be achieved even in an environment in which temperature fluctuates.

Figure 5:
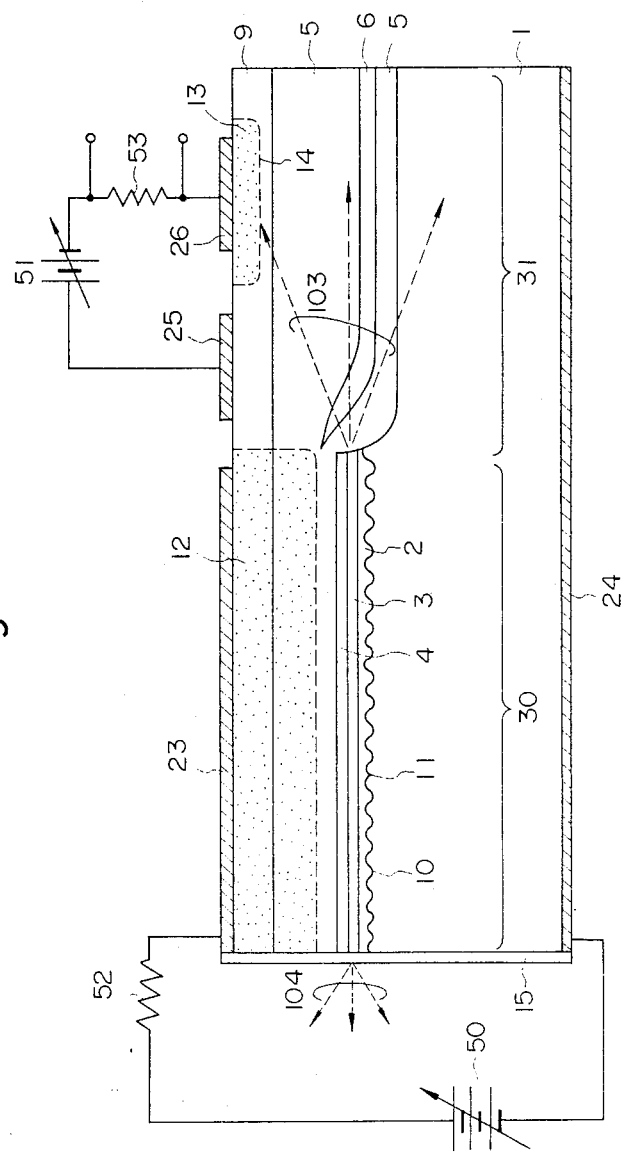
FIG. 5 is a schematic longitudinal-sectional diagram illustrating another embodiment of the DFB laser with a monitor of the present invention.

FIG. 5 illustrates another embodiment of the present invention. The window region 31 is provided only at the righthand end of the light emitting layer 3, and the left-hand end of the layer from which the main output 104 is emitted to the outside is covered with an antireflection coating film 15. Incidentally, the DFB laser having the quarter-wave phase shift 11 exhibits the most excellent single wavelength property when the both ends of the light emitting layer 3 are non-reflective. The nonreflection is substantially materialized by the window region 31 or antireflection coating film 15. The operation of this embodiment is the same as in the case of FIG. 3.

While in the above no reference is made to a stripe structure for stabilization of a lateral mode, the present invention is also applicable to various stripe structures such as a buried stripe structure, a plano-convex waveguide structure, and so forth. Further, the semiconductor materials used are not limited specifically to those of the InGaAsP/InP systems, but the invention can easily be applied to other materials of AlInGaAs/InP systems, AlGaAs/GaAs systems, etc.

As will be appreciated from the above, according to the present invention, a practical DFB laser with a monitor can be realized which exhibits high monitoring efficiency and permits stable monitoring even in an environment in which temperature fluctuates.

Moreover, according to the present invention, a small and easy-to-manufacture DFB laser with a monitor can be obtained because the monitor region is provided in a part of the window region 31. This not only precludes the necessity of the photodiode which is disposed independently of the DFB laser in the prior art, but also eliminates the possibility of an erroneous operation owing to their positional deviation relative to each other, enabling the materialization of low-cost, highly reliable monitoring of laser output. Such a DFB laser with a monitor is of very wide application over the fields of optical fiber communications and photometry, and hence is of great utility.

What we claim is:

1. In a distributed feedback semiconductor laser with a monitor, having a substrate, a DFB region on the substrate comprising a light emitting layer, periodic corrugations extending in the direction of travel of light and a laser DFB region pn junction, the improvement comprising a window region provided on said substrate on at least one end of the light emitting layer with a semiconductor material having an energy gap greater than the energy gap of the light emitting layer, and a cap layer of first conductivity type provided on the DFB region and the window region having an energy gap smaller than the energy gap of the light emitting layer and a monitor pn junction electrically isolated from the DFB regoin pn junction so that a part of the light output emitted from the light emitting layer reaches the monitor pn junction by Fresnel diffraction of the light output in the window region and an electrical output for monitoring the light output is obtained through the monitor pn junction in the cap layer, the monitor pn junction being formed in the cap layer of first conductivity type by providing a second conductivity type region in the cap layer, and electrodes on the cap layer on the DFB region for effecting laser oscillation and others disposed for monitoring.

2. A distributed feedback semiconductor laser according to claim 1, in which the monitor pn junction in the cap layer for obtaining the electrical output for monitoring is provided in the cap layer on the window region, which is provided at only one end of the light emitting layer.

3. A distributed feedback semiconductor laser according to claim 1, in which the monitor pn junction in the cap layer for obtaining the electrical output for monitoring is provided in the cap layer on one of two window regions, which are positioned at two opposite ends of the light emitting layer.

* * * * *